(12) United States Patent
Mikyska

(10) Patent No.: US 7,276,948 B2
(45) Date of Patent: Oct. 2, 2007

(54) RESET CIRCUIT

(75) Inventor: Robert Mikyska, Dolni Dobrouc (CZ)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 11/012,712

(22) Filed: Dec. 15, 2004

(65) Prior Publication Data

US 2005/0134334 A1 Jun. 23, 2005

Related U.S. Application Data

(60) Provisional application No. 60/530,848, filed on Dec. 18, 2003.

(51) Int. Cl.
*H03K 3/02* (2006.01)
(52) U.S. Cl. .................. 327/198; 327/142
(58) Field of Classification Search ............ 327/541, 327/543; 323/901
See application file for complete search history.

(56) References Cited

U.S. PATENT DOCUMENTS 5,619,164 A * 4/1997 Tomishima ............. 327/541
5,631,599 A * 5/1997 Bacrania et al. .......... 327/542
6,342,781 B1* 1/2002 Laraia ...................... 323/313

OTHER PUBLICATIONS

"STM809, STM810, STM811, STM812: Reset Circuit", Feb. 2004. pp. 1-18. Accessible online at <http://www.st.com/stonline/books/pdf/docs/9873.pdf>.

* cited by examiner

*Primary Examiner*—Quan Tra
*Assistant Examiner*—Khareem E. Almo
(74) *Attorney, Agent, or Firm*—Lisa K. Jorgenson; Renee Michelle Leveque

(57) ABSTRACT

A reset circuit includes a power supply supplying a power supply voltage, and a band-gap reference that generates a voltage reference signal. A resistor start-up circuit is responsive to the voltage reference signal, and further responsive to an increase in the power supply voltage. The resistor start-up circuit generates a first current when the power supply voltage increases to a first predetermined voltage, and further generates a second current when the power supply voltage increases to a second predetermined voltage. When the second current generated by the resistor start-up circuit is supplied to a resistor divider, the resistor diver delivers an output voltage that is a predetermined portion of the power supply voltage. A comparator compares the voltage reference signal with the resistor divider output voltage, and generates a reset signal when the resistor divider output voltage equals the voltage reference signal.

10 Claims, 6 Drawing Sheets

100

RESET CIRCUIT

BENEFIT CLAIM OF PRIOR-FILED APPLICATION

This application claims priority benefit of U.S. Provisional Patent Application Ser. No. 60/530,848, filed Dec. 18, 2003, entitled "Resistor Startup Circuit for Reset Chip", which is hereby incorporated herein by reference.

BACKGROUND

Reset circuits have been routinely utilized as a supervisory device to monitor a power supply that supplies power to voltage sensitive electronic devices such as a microprocessor. The reset circuit performed a single function, that of asserting a reset signal whenever the power supply voltage dropped below a preset level. Once the reset signal had been asserted, the reset circuit continued to assert the reset signal until the power supply voltage had risen above a preset threshold for a predetermined period of time.

Such power supply voltage detection circuits could be falsely triggered when power was initially applied to the voltage sensitive electronic devices, and during power supply shutdown. By falsely triggering, the reset circuit could interrupt the operation of the voltage sensitive electronic devices.

FIG. 1 is an electrical block diagram of a prior art reset circuit 100 utilized to monitor the power supply supplying power to a voltage sensitive electronic device. The prior art reset circuit 100 generated a reset signal when the power supply voltage dropped below a predetermined value. The prior art reset circuit 100 included a bandgap reference 102, a resistor start-up circuit 104, a resistor divider comprising a resistor 106 and a resistor 108, and a comparator 110. The bandgap reference 102 provided two outputs, bgout supplying a voltage reference signal, Vbgout, and pbias providing a current reference signal, Vpbias. The resistor start-up circuit 104 provided two inputs, a Vcc input connected to and used to monitor the power supply voltage Vcc, and a bgout input connected to the bandgap reference 102, and one output res_div coupled to resistor 106. The comparator 110 provided three inputs, inm connected to the voltage reference signal, Vbgout, inp connected to the center tap of the voltage divider, and pbias connected to the current reference signal, Vpbia. The comparator 110 had a single output, vcc_ok, providing a reset signal when the power supply voltage dropped below a predetermined voltage during power down and power up.

In the prior art reset circuit 100, when the power supply voltage fell below the predetermined voltage, typically 2.1 volts, the bandgap circuit 102 could not be reliably used as a voltage reference and resulted in erroneous reset signals being generated. The resistor start-up circuit 104 was used to supply power to the resistor divider when the power supply voltage was greater than 2.1 volts, and disconnected power to the resistor divider when the power supply voltages fell below 2.1 volts. It will be appreciated that the actual predetermined voltage varied in value due to variations in processing of the reset circuit.

In normal operation, the comparator 110 provided an output, vcc_ok, which was a logic high when the power supply voltage, Vcc>Vrst, typically 2.63 volts. The current reference provided a constant current of approximately 250 nA and was used to stabilize the operation of the comparator 110. The predetermined power supply voltage was determined by comparing the voltage reference signal, Vbgout, with the output of the resistor divider. The bandgap reference 102 generated a voltage output of 1.25 volts. Resistor 106 and resistor 108 were selected to provide an output of 1.25 volts when the power supply voltage was at the predetermined power supply voltage.

FIG. 2 is an electrical diagram of the resistor start-up circuit 104 utilized in the prior art reset circuit of FIG. 1. The resistor start-up circuit 104 comprised transistor 206, transistor 208 and transistor 210 in branch 202. The source of transistor 206 was connected to Vcc; and the gate was connected to the voltage reference signal, Vbgout, generated by the bandgap reference 102. The drain of transistor 206 was connected to the gate and drain of diode connected transistor 208. The source of transistor 208 was connected to the gate and drain of diode connected transistor 210 and to the gate of transistor 216. The source of transistor 210 was connected to Vss (ground). Transistor 206 was a PMOS transistor, and transistor 208 and transistor 210 were NMOS transistors.

The resistor start-up circuit 104 also comprised transistor 212, transistor 214 and transistor 216 in branch 204. The source of transistor 212 was connected to Vcc, the gate was connected to the drain of diode connected transistor 212 and also to the gate of transistor 218. The drain of transistor 212 was connected to the gate and drain of diode connected transistor 214. The source of transistor 214 was connected to the drain of transistor 216. The source of transistor 216 was connected to Vss (ground). The source of transistor 218 was connected to Vcc while the drain was connected to resistor 106. The gate of transistor 218 was connected to the gate of transistor 212. Transistor 212 and transistor 218 were PMOS transistors, and transistor 214 and transistor 216 were NMOS transistors.

Transistor 206 functioned as a switched current source generating current when branch 202 was conducting. Branch 202 was conducting when $Vcc-Vbgout>Vtp_{206}$, where $Vtp_{206}$ is the threshold voltage of transistor 206, and $Vcc>Vsd_{206}+Vtn_{208}+Vtn_{210}$ where $Vsd_{206}$ is the source to drain voltage across transistor 206, $Vtn_{208}$ is the threshold voltage of transistor 208, and $Vtn_{210}$ is the threshold voltage of transistor 210.

Transistor 212 conducted when branch 204 was conducting. Branch 204 was conducting when $Vcc>Vtn_{214}+Vtp_{212}+Vds_{216}$ where $Vtn_{214}$ is the threshold voltage of transistor 214, $Vtp_{212}$ is the threshold voltage of transistor 212, and $Vds_{216}$ is the drain to source voltage across transistor 216.

In summary, when the voltage reference signal, Vbgout, which was coupled to the gate of transistor 206 rose sufficiently in voltage, the transistors of branch 202 were conducting. The current through transistor 210 was mirrored by transistor 216 in branch 204 and was set at twice the current of branch 202. When transistor 216 began conducting, transistor 212 and transistor 214 in branch 204 were also able to conduct. The current in branch 204 was set by establishing the w/l ratio of transistors 210 and 216 in a manner well known in the art. The current through transistor 212 when branch 204 was conducting was mirrored in transistor 218, generating the output signal, res_div, at the drain of transistor 218. When transistor 218 was conducting, Vcc was effectively supplied to the resistor divider because the current mirrored in transistor 218 was set 62.5 times the current through transistor 212, however, the resistance of the resistor divider is approximately 5.5 MegOhms, and thus the actual current delivered is typically less than 1 micro-Amp.

FIG. 3 is a graph depicting the operation of the prior art reset circuit of FIG. 1. Variations in the power supply voltage, Vcc, during power-up and power-down, depicted by waveform 302, is indicated by triangle symbols. The resistor divider voltage signal, depicted in waveform 304, is indicated by plus symbols. The voltage reference output, Vbgout, generated by the bandgap reference 102, depicted by waveform 306, is indicated by circle symbols. The reset output pulse, Vcc_ok, depicted by waveform 308, is indicated by asterisk symbols.

As can be by waveform 308, in addition to the desired reset pulse being generated by the reset circuit 100 during power-up, a transient pulse 310 was generated when the power supply voltage initially supplied to the reset circuit 100 reached a value between approximately 1.4 volts and 1.6 volts. The reset circuit 100 during power-down also generated a transient pulse 312 when the power supply voltage dropped below approximately 1.6 volts.

It is desirable to provide a means to improve the sensitivity of the power supply detection circuit by suppressing false triggering when powering up the power supply, and during power supply shutdown. It is also desirable to provide a means to reduce the current consumption of the power supply detection circuit.

BRIEF DESCRIPTION OF THE DRAWINGS

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description, like reference numerals are used to describe the same, similar or corresponding parts in the several views of the drawings.

DETAILED DESCRIPTION

Figure 1:
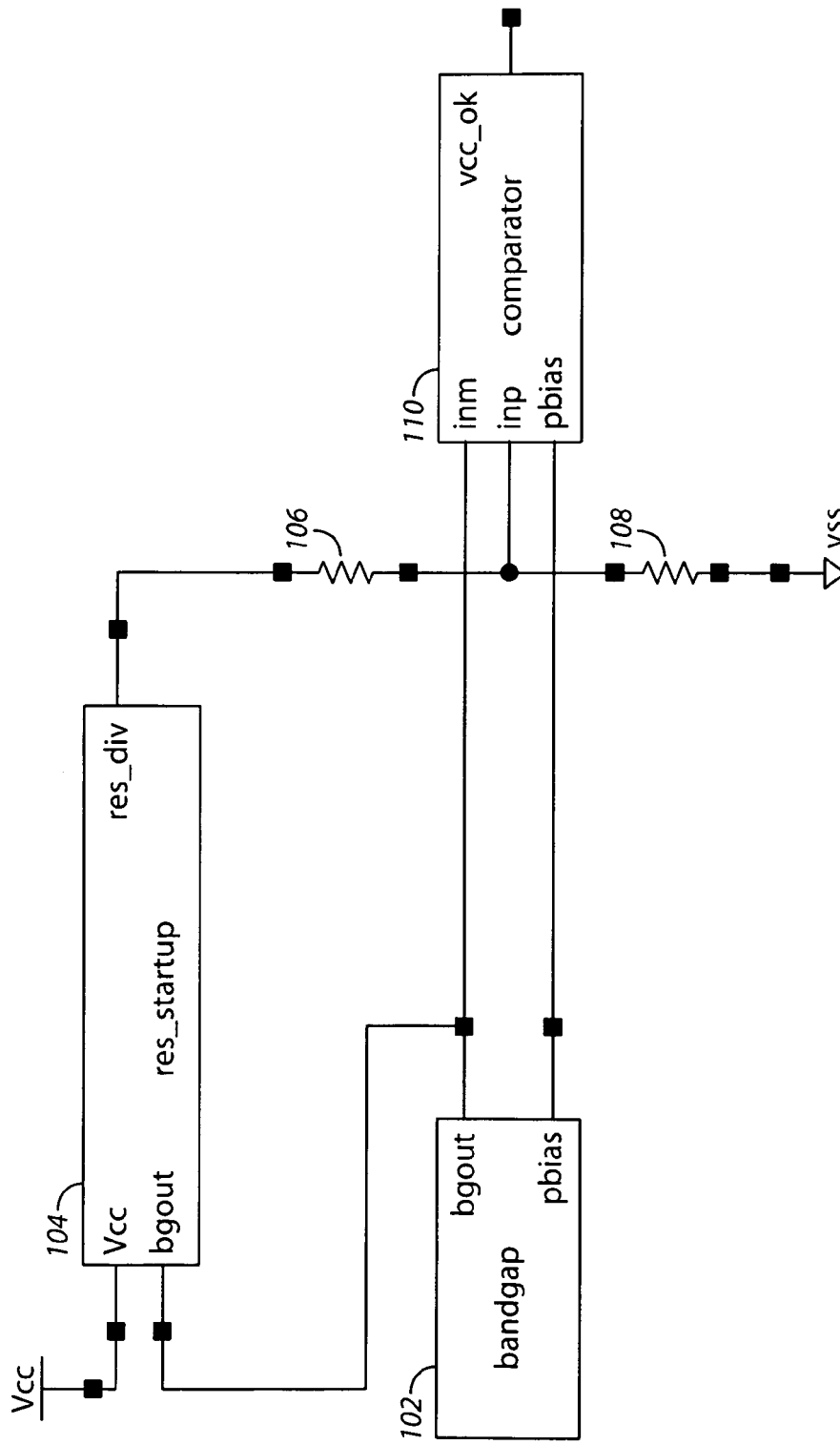
FIG. 1 is an electrical block diagram of a prior art reset circuit.
Figure 2:
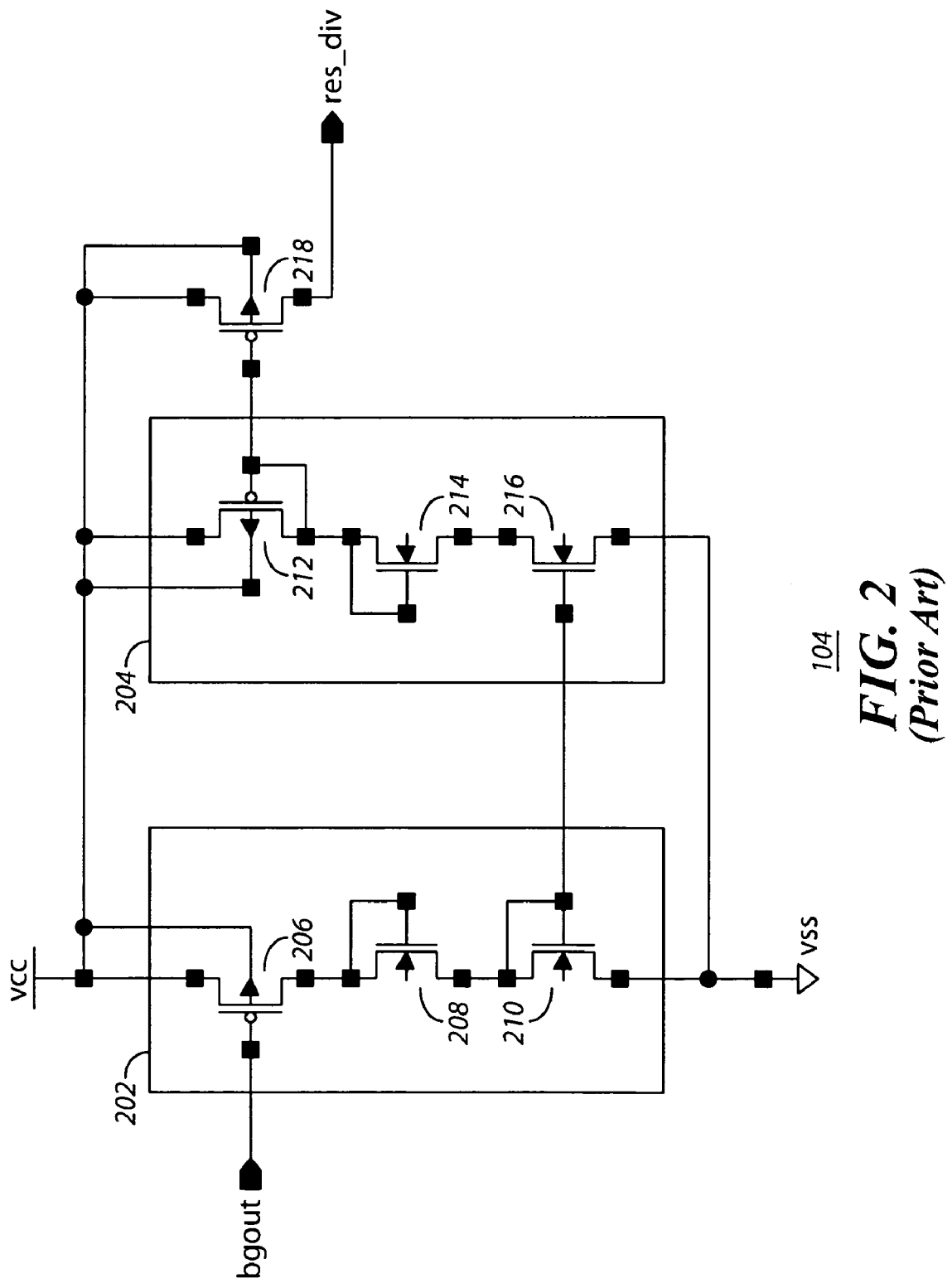
FIG. 2 is an electrical diagram of a resistor start-up circuit utilized in the prior art reset circuit of FIG. 1.
Figure 3:
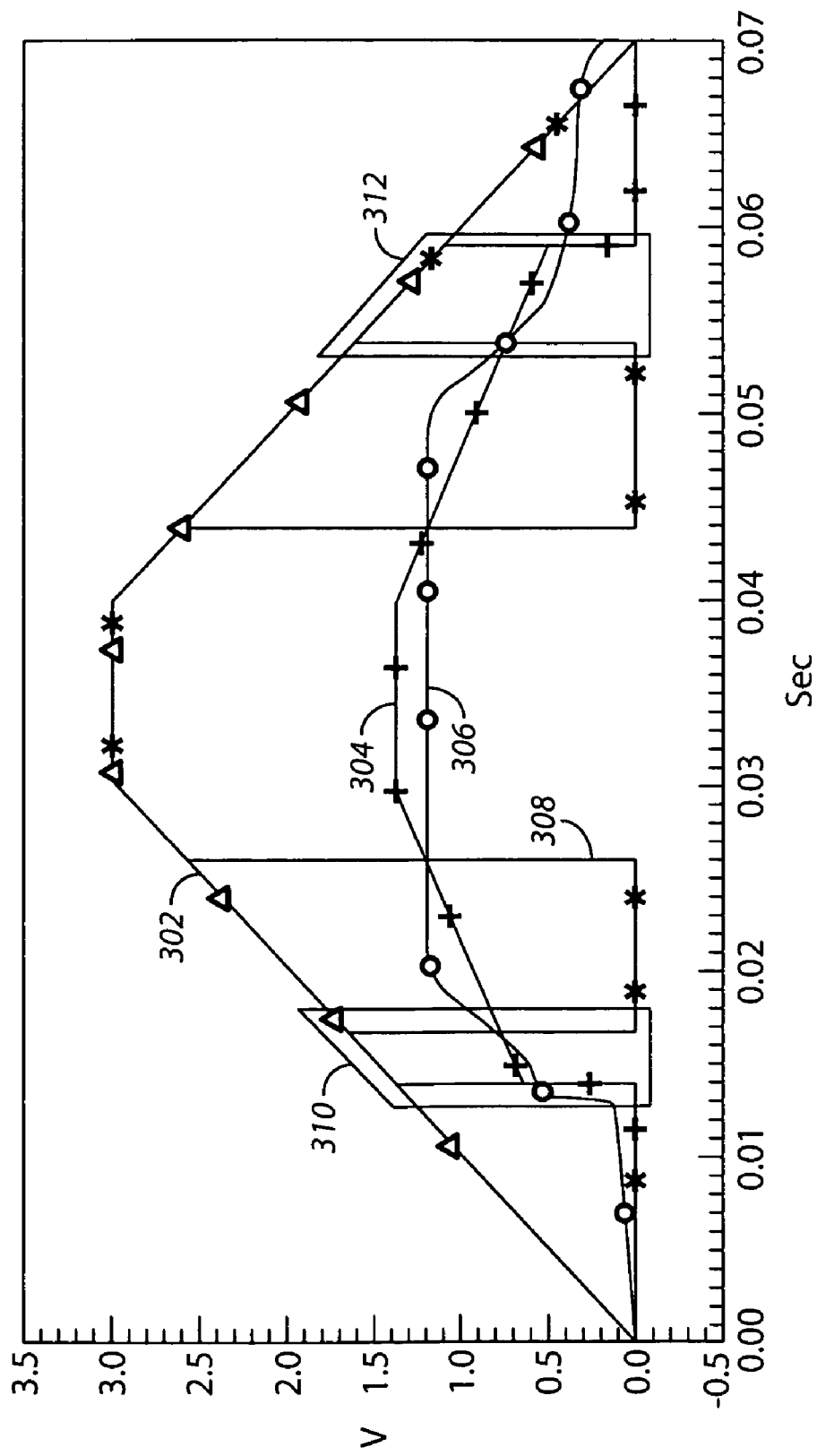
FIG. 3 is a graph depicting the operation of the prior art reset circuit of FIG. 1.
Figure 4:
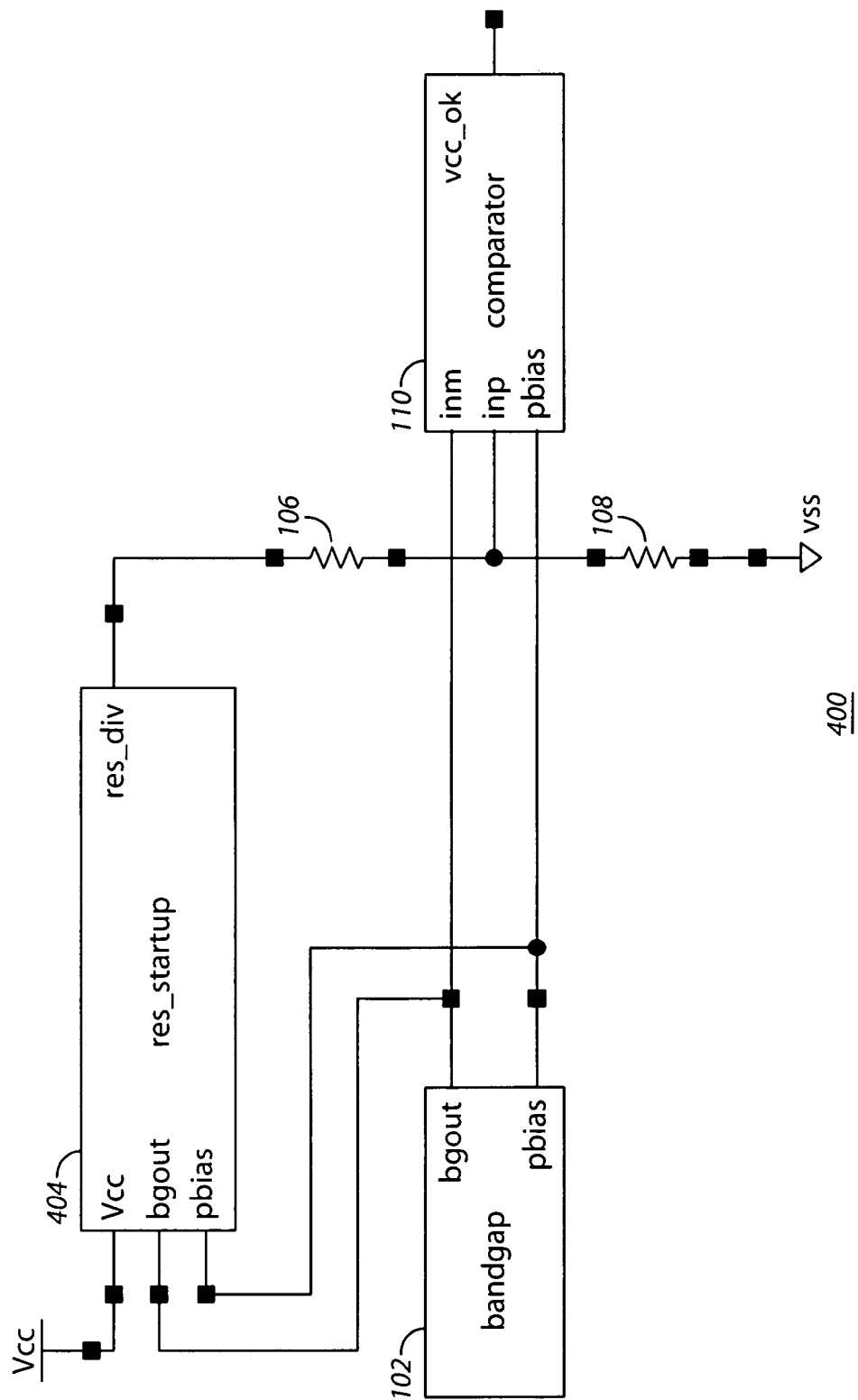
FIG. 4 is an electrical block diagram of a reset circuit in accordance with certain embodiments of the present invention.

FIG. 4 is an electrical block diagram of a reset circuit 400 in accordance with certain embodiments of the present invention utilized to monitor the power supply powering a voltage sensitive electronic device. Reset circuit 400 generates a reset signal when the power supply voltage drops below a predetermined value. Reset circuit 400 includes a bandgap reference 102, a resistor start-up circuit 404, a resistor divider comprising a resistor 106 and a resistor 108, and a comparator 110. The bandgap reference 102 provides two outputs, bgout supplying a voltage reference signal, Vbgout, and pbias providing a current reference signal, Vpbias. The resistor start-up circuit 404 provides three inputs, a Vcc input which connects to and used to monitor the power supply voltage Vcc, a bgout input which connects to the voltage reference signal, Vbgout, and a pbias input which connects to current reference signal, Vpbias. The resistor start-up circuit 404 also provides one output, res_div, which couples to resistor 106. The comparator 110 provides three inputs, inm which connects to the voltage reference signal, Vbgout, inp which connects to the center tap of the voltage divider, and pbias which connects to the current reference signal, Vpbias. The comparator 110 has a single output, vcc_ok, which provides a reset signal when the power supply voltage drops below a predetermined voltage during power down and power up.

When the power supply voltage falls below a predetermined power supply voltage, typically 2.1 volts, the bandgap circuit 102 can not be reliably used as a voltage reference as described above. The resistor start-up circuit 404 is used to supply power to the resistor divider when the power supply voltage is greater than 2.1 volts, and disconnected power to the resistor divider when the power supply voltages falls below 2.1 volts. It will be appreciated that the actual predetermined voltage varied in value due to variations in processing of the reset circuit.

In normal operation, the comparator 110 provides an output, vcc_ok, which is a logic high when the power supply voltage, Vcc and the resistor divider input are substantially equal, defined as Vrst, which is set to a predetermined power supply voltage, typically 2.63 volts. The predetermined power supply voltage is determined by comparing the voltage reference signal, Vbgout, with the output of the resistor divider. The bandgap reference 102 generates a voltage output of 1.25 volts. Resistor 106 and resistor 108 are selected to provide an output of 1.25 volts when the power supply voltage is at the predetermined power supply voltage. Unlike the prior art reset circuit 100, the reset circuit 400 in accordance with the present invention overcomes the problem of erroneous reset pulses being generated through improvements incorporated in the resistor start-up circuit 404 of the present invention to be described below.

The bandgap reference 102 generates a voltage reference signal, Vbgout that is 1.25 volts, and a current reference signal, Vpbias. The resistor start-up circuit 404 has three inputs, a Vcc input connected to and used to monitor the power supply voltage, an input connected to the bandgap reference 102 to monitor the voltage reference signal, Vbgout, and a second input connected to the bandgap reference 102 to monitor the current reference signal, Vpbias. When the power supply voltage falls below a predetermined value of 2.1 volts, the bandgap circuit 102 is not suitable for use as a voltage reference, because the voltage reference signal, Vbgout, generated is not constant. The resistor start-up circuit 404 is used to supply power to the resistor divider when the power supply voltage is greater than the predetermined 2.1 volt value, and disconnected power to the resistor divider when the power supply voltages falls below the predetermined 2.1 volt value. It will be appreciated that the predetermined value of 2.1 volts typically varied in value due to variations in processing of the reset circuit 400.

The resistor divider comprising resistor 106 and resistor 108 provides an output, div-out, which couples to an input of the comparator 110. The voltage reference signal, Vbgout, and the current reference signal, Vpbias couple to inputs of the comparator 110. In normal operation, the comparator 110 provides an output, vvc_ok, which is a logic high when the power supply voltage, Vcc and the resistor divider input are substantially equal, defined as Vrst, which is typically 2.63 volts, as described above.

Figure 5:
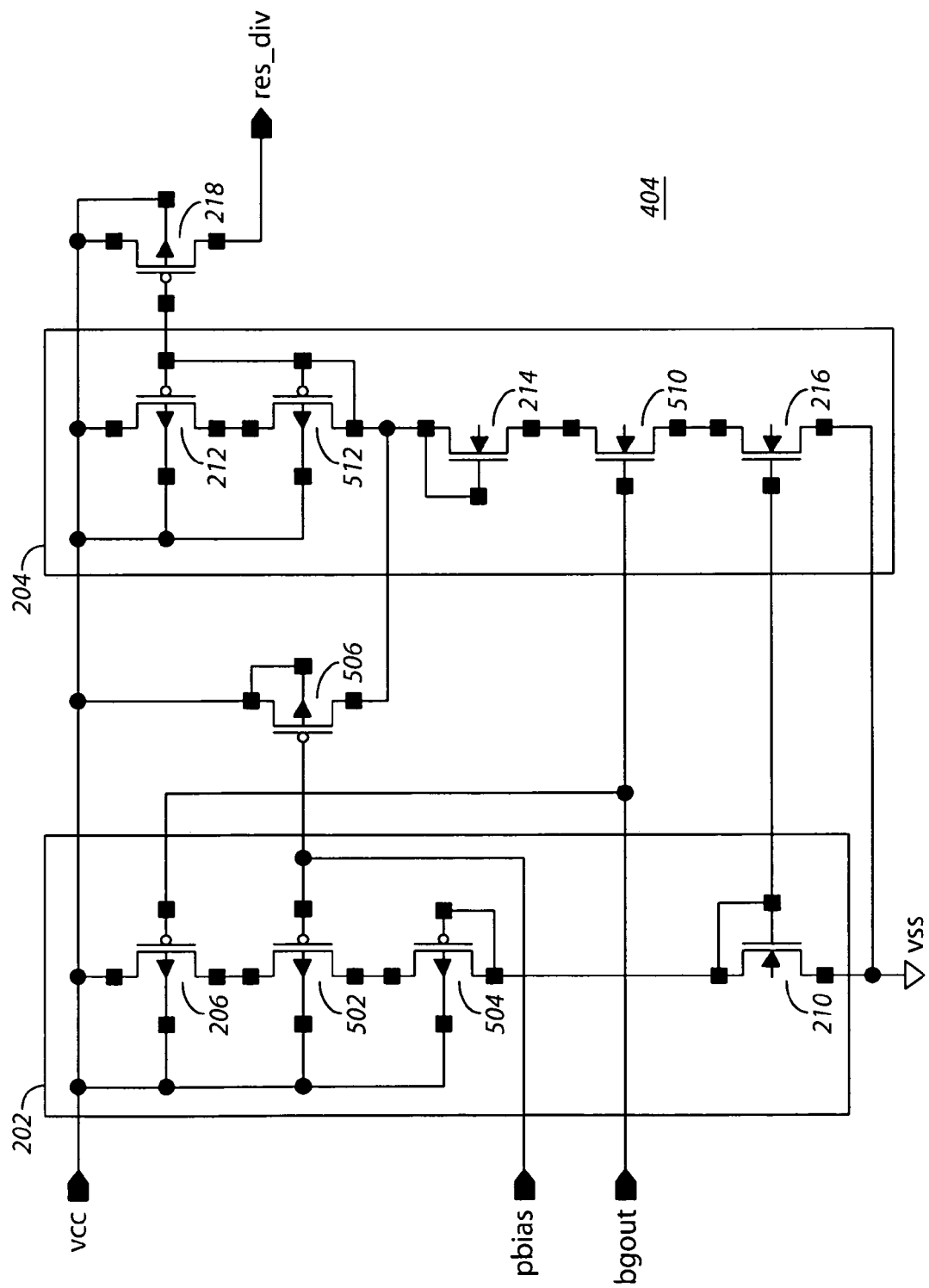
FIG. 5 is an electrical diagram of a resistor start-up circuit utilized in the reset circuit of FIG. 4 in accordance with certain embodiments of the present invention.

FIG. 5 is an electrical diagram of the resistor start-up circuit 404 utilized in the reset circuit of FIG. 4 in accordance with certain embodiments of the present invention. The resistor start-up circuit 404 comprises transistor 206, transistor 502, transistor 504, and transistor 210 in branch 202, and transistor 212, transistor 512, transistor 214, transistor 510 and transistor 216 in branch 204. A transistor 506 couples between branch 202 and branch 204, and transistor 218 also couples to branch 204, as will be described below. Transistor 206, transistor 212, transistor 218, transistor 502, transistor 504, transistor 506, and transistor 512 are PMOS transistors. Transistor 210, transistor 216, transistor 214, and transistor 510 are NMOS transistors.

The source of transistor 206 connects to Vcc; the gate connects to the voltage reference signal, Vbgout, generated by the bandgap reference 102, and to the gate of transistor 510. The drain of transistor 206 connects to the source of transistor 502. The drain of transistor 502 connects to the source of transistor 504. Transistor 504 is diode connected, and the gate and drain connect to the drain and gate of transistor 210, which is also diode connected, and to the gate of transistor 216. The gate of transistor 502 connects to the current reference signal, Vpbias, and to the gate of transistor 506. The source of transistor 210 connects to Vss (ground)

The source of transistor 216 connects to Vss (ground). The drain of transistor 216 connects to the source of transistor 510. The drain of transistor 510 connects to the source of transistor 214. Transistor 214 is diode connected and the drain and gate connect to the drain and gate of transistor 512 which is also diode connected. The gate and drain of transistor 214 also connects to the drain of transistor 506, the gate of transistor 212 and the gate of transistor 218. The source of transistor 512 connects to the drain of transistor 212. The source of transistor 212 connects to Vcc. The sources of transistor 506 and transistor 218 also connect to Vcc, and the drain of transistor 218 connects to resistor 106.

Transistor 206 functions as a switch enabling branch 202 to conduct. Transistor 502 and transistor 506 generate a current of approximately 250 nA in response to the pbias input. Branch 202 is conducting when Vcc−Vbgout>$Vtp_{206}$, where $Vtp_{206}$ is the threshold voltage of transistor 206, and Vcc>$Vsd_{206}$+$Vsd_{502}$+$Vtp_{504}$+$Vtn_{210}$ where $Vsd_{206}$ is the source to drain voltage across transistor 206, $Vsd_{502}$ is the source to drain voltage across transistor 502, $Vtp_{504}$ is the threshold voltage of transistor 504, and $Vtn_{210}$ is the threshold voltage of transistor 210.

Transistor 212 conducts when branch 204 is conducting. Branch 204 is conducting when Vbgout>$Vtn_{510}$+$Vds_{216}$ where $Vtn_{510}$ is the threshold voltage of transistor 510 and $Vds_{216}$ is the source to drain voltage of transistor 216, and Vcc>$Vtp_{212/512}$+$Vtn_{214}$+$Vds_{510}$+$Vds_{216}$ where $Vtp_{212/512}$ is the combined threshold voltages of transistor 212 and transistor 512, $Vtn_{214}$ is the threshold voltage of transistor 214, $Vds_{510}$ is the drain to source voltage of transistor 510, and $Vds_{216}$ is the drain to source voltage of transistor 216.

Transistor 510 was added to the resistor start-up circuit 404 to control the transient 310 generated in the prior art reset circuit 100 during power up. In the resistor start-up circuit 404 in accordance with the present invention, during power-up when Vcc<1.8V, Vbgout<$Vtn_{510}$ and transistor 512 is not conducting. As a result, the operation of transistor, 512 prevents the transient pulse 308 from being generated, as when the power supply voltage rose to between 1.4 volts and 1.6 volts in the prior art resistor start-up circuit 104 during power up.

Transistor 512 was added to control current drain, and transistor 502 and transistor 506 were added to the resistor start-up circuit 404 to control the transient pulse 312 during power-down. Transistor 506 discharges the gate to source capacitance of transistor 212, transistor 218, and transistor 512. Transistor 502 and transistor 506 mirror the current reference signal, Vpbias. Transistor 502 and transistor 506 generate a current of approximately 250 nA. As a result transistor 506 effects a rapid discharge of $Cgs_{212}$, $Cgs_{218}$, and $Cgs_{512}$, where $Cgs_{212}$ is the gate to source capacitance of transistor 212, $Cgs_{218}$ is the gate to source capacitance of transistor 218, and $Cgs_{512}$ is the gate to source capacitance of transistor 512. In the prior art resistor start-up circuit 104, the gate to source capacitance of transistor 212 and transistor 218 maintained transistor 218 to provide power to the resistor divider when the power supply voltage dropped below approximately 1.6 volts and resulted in the generation of transient pulse 312.

In summary, when the voltage reference signal, Vbgout, which is coupled to the gate of transistor 206 rises to a predetermined level, the transistors of branch 202 are conducting. The current through transistor 210 in branch 202 is set to 250 nA by transistor 502, which operates as a current source. The current through transistor 210 is mirrored by transistor 216 in branch 204 and is set at twice the current of branch 202. When transistor 216 begins conducting, transistor 214, transistor 512, and transistor 212 in branch 204 are also able to conduct providing transistor 510 is conducting. Since transistor 510 begins conducting at a higher power supply voltage than in the prior art resistor start-up circuit 104, the transient pulse 310 is eliminated. The current in branch 204 is set by establishing the w/l ratio of transistors 210 and 216 in a manner well known in the art. The current through transistor 212 when branch 204 is conducting is mirrored in transistor 218, generating the output signal, res_div, at the drain of transistor 218. When transistor 218 is conducting, Vcc was effectively supplied to the resistor divider because the current mirrored in transistor 218 is set 66.6 times the current through transistor 212, however, the resistance of the resistor divider is approximately 5.5 MegOhms, and thus the actual current delivered is typically less than 1 micro-Amp.

Figure 6:
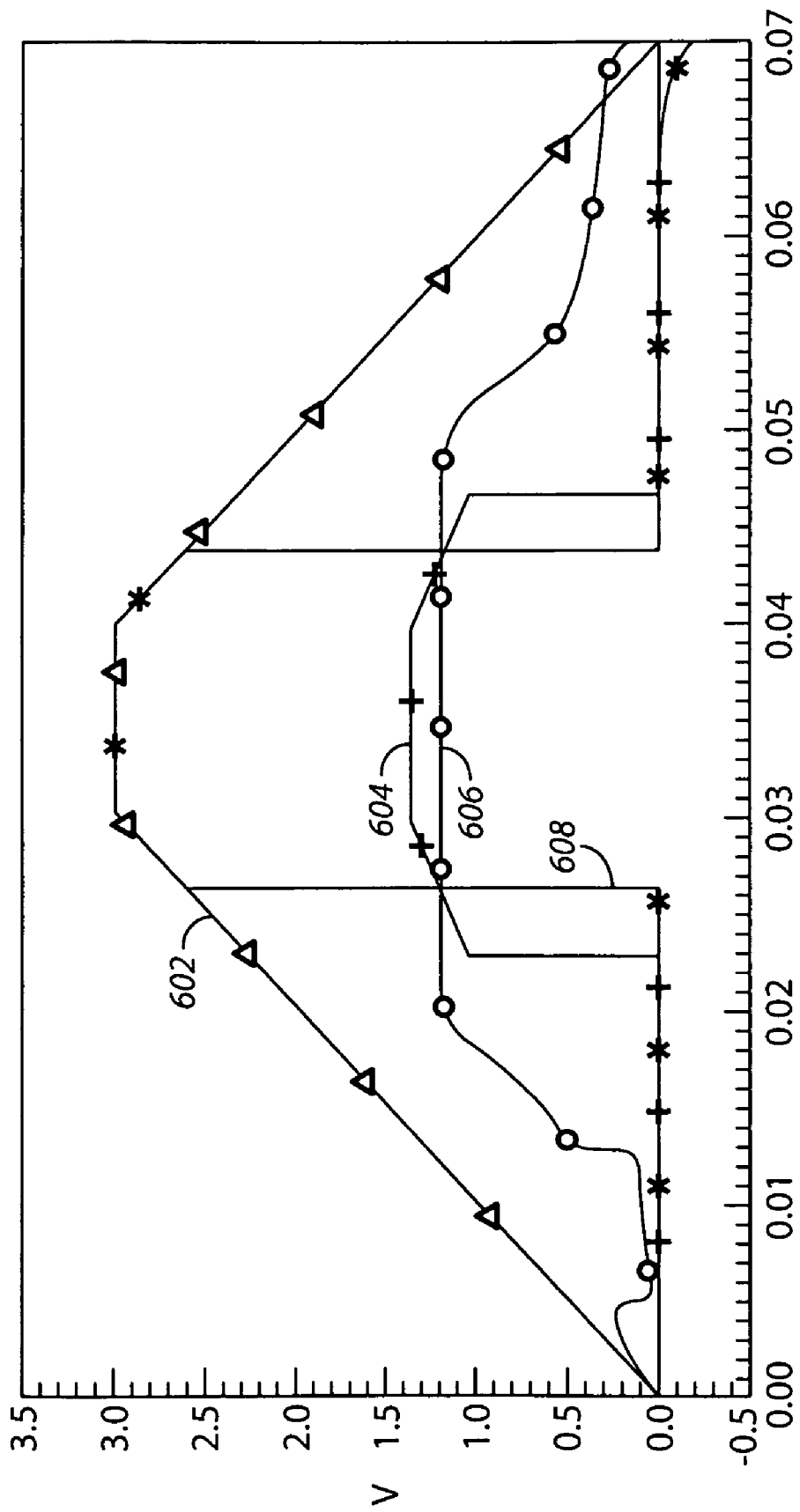
FIG. 6 illustrates a graph depicting the operation of the reset circuit of FIG. 4 in accordance with certain embodiments of the present invention

FIG. 6 provides a graph depicting the operation of the reset circuit 400 of FIG. 4. Variation in the power supply voltage, Vcc, during power-up and power-down, depicted by waveform 602, is indicated by triangle symbols. The res_div voltage, output of res_div signal, depicted in waveform 604, is indicated by plus symbols. The voltage reference output, Vbgout, generated by the bandgap reference 102, depicted by waveform 606, is indicated by circle symbols. The reset output pulse, Vcc_ok, depicted by waveform 608, is indicated by asterisk symbols.

As is shown in FIG. 6, the transient pulses generated during power-up and power-down of the prior art resistor start-up circuit 104 have been prevented by the improvements made to the resistor start-up circuit 404 in accordance with the present invention.

The present invention described above is implemented using a CMOS process, and is ideally suited for implementation in any established CMOS process.

The invention claim is:

1. A resistor start-up circuit for a reset circuit, comprising:
   a current source having a control input, and a current output for delivering a first current, said current source being coupled to a power supply voltage;
   a first current mirror having a mirror input and a mirror output, said mirror input being coupled to said current output for receiving the first current, and in response thereto for delivering a second current at said mirror output;
   a first transistor switch, having a control electrode, a first output electrode and a second output electrode, said first output electrode being coupled to said mirror output of said first current mirror;
   a second current mirror having a mirror input and a mirror output, wherein said mirror input is coupled to said second output electrode of said first transistor switch;
   said control input of said current source is coupled to a voltage reference signal wherein said current source delivers the first current when the power supply voltage increases to a first predetermined value, and
   said input electrode of said first transistor switch is coupled to the voltage reference signal, wherein said first transistor conducts the second current to said mirror input of said second current mirror when the power supply voltage increases to a second predetermined value;
   wherein said mirror output of said second current mirror delivers a current to a resistor divider in response to the second current being generated, and further comprising:
   a first transistor having a control electrode, a first output electrode and a second output electrode, said first output electrode being coupled to said current output of said current source, and said second output electrode being coupled to said mirror input of said first current mirror; and
   a second transistor having an control electrode, a first output electrode and a second output electrode, said control electrode being coupled to the current reference signal, said first output electrode being coupled to the power supply voltage, and said second output electrode being coupled to said mirror input of said second current mirror,
   wherein the first current delivered by said current source to said first transistor is mirrored as a fourth current by said second transistor when the power supply voltage is equal to or greater than the first predetermined value.

2. The resistor start-up circuit according to claim 1, wherein the first current is equal to the second current.

3. The resistor start-up circuit according to claim 1, wherein the first current is a multiple of the second current.

4. The resistor start-up circuit according to claim 1, wherein the third current is a multiple of the second current.

5. The resistor start-up circuit according to claim 1, wherein said first transistor switch is a CMOS transistor having a gate electrode, a source electrode and a drain electrode,
   wherein said control electrode is said gate electrode, said first output electrode is said source electrode, and said second output electrode is said drain electrode.

6. The resistor start-up circuit according to claim 1, wherein the voltage reference signal is generated by a band-gap reference, and wherein
   the voltage reference signal generated has a value of 1.25 volts.

7. The resistor start-up circuit according to claim 1, wherein the first predetermined value for the power supply voltage corresponds to substantially 1.4 volts.

8. The resistor start-up circuit according to claim 1, wherein the second predetermined value for the power supply voltage corresponds to substantially 2.63 volts.

9. The resistor start-up circuit according to claim 1, wherein
   said second transistor is a CMOS transistor having a gate electrode, a source electrode and a drain electrode, wherein said control electrode is said gate electrode, said first output electrode is said source electrode, and said second output electrode is said drain electrode, and wherein
   said third transistor is a CMOS transistor having a gate electrode, a source electrode and a drain electrode, wherein said control electrode is said gate electrode, said first output electrode is said source electrode, and said second output electrode is said drain electrode.

10. The resistor start-up circuit according to claim 1 wherein said second current mirror comprises a first transistor having a gate to source capacitance and a second transistor having a gate to source capacitance, wherein the gate to source capacitance is charged when said second current mirror is operating, and
    wherein the gate to source capacitance is discharged by the fourth current.

* * * * *